United States Patent
Blakes (10) Patent No.: US 10,197,647 B2
(45) Date of Patent: Feb. 5, 2019

(54) PASSIVE ADAPTIVE QUENCH PROPAGATION CIRCUIT

(71) Applicant: Siemens Healthcare Limited, Camberley (GB)

(72) Inventor: Hugh Alexander Blakes, Longworth (GB)

(73) Assignee: Siemens Healthcare Limited, Camberley (GB)

( * ) Notice: Subject to any disclaimer, the term of this patent is extended or adjusted under 35 U.S.C. 154(b) by 415 days.

(21) Appl. No.: 15/042,359

(22) Filed: Feb. 12, 2016

(65) Prior Publication Data

US 2016/0238680 A1     Aug. 18, 2016

(30) Foreign Application Priority Data

Feb. 12, 2015   (GB) .................................. 1502343.5

(51) Int. Cl.
| | | |
|---|---|---|
| H01F 6/02 | (2006.01) | |
| G01R 33/28 | (2006.01) | |
| G01R 33/38 | (2006.01) | |
| G01R 33/3815 | (2006.01) | |

(52) U.S. Cl.
CPC ....... *G01R 33/3815* (2013.01); *G01R 33/288* (2013.01); *G01R 33/3804* (2013.01); *H01F 6/02* (2013.01)

(58) Field of Classification Search
CPC .............. G01R 33/3815; G01R 33/288; G01R 33/3804; H01F 6/02
See application file for complete search history.

(56) References Cited

U.S. PATENT DOCUMENTS

| | | | | |
|---|---|---|---|---|
| 6,147,844 A | * | 11/2000 | Huang ............... | G01R 33/3815 361/141 |
| 8,204,563 B2 | | 6/2012 | Wang et al. | |
| 8,780,510 B2 | | 7/2014 | Huang et al. | |
| 2006/0158795 A1 | | 7/2006 | Tsuchiya et al. | |
| 2006/0158796 A1 | | 7/2006 | Butcher et al. | |
| 2008/0232004 A1 | * | 9/2008 | Blakes ................... | H02H 7/001 361/19 |
| 2009/0002902 A1 | * | 1/2009 | Bittner ................... | H02H 7/001 361/19 |
| 2010/0283565 A1 | * | 11/2010 | Blakes ................. | G01R 33/288 335/216 |
| 2013/0200896 A1 | | 8/2013 | Maciejewski | |

FOREIGN PATENT DOCUMENTS

| | | |
|---|---|---|
| GB | 2456308 A | 7/2009 |
| JP | 2007234689 A | 9/2007 |

* cited by examiner

*Primary Examiner* — Rodney A Bonnette
(74) *Attorney, Agent, or Firm* — Schiff Hardin LLP (57) ABSTRACT

An adaptive passive quench propagation circuit in combination with a superconducting magnet having multiple superconducting coils electrically connected in series between a power supply terminal and a ground reference voltage terminal, has a superconducting switch arranged to electrically connect the power supply terminal and the ground reference voltage terminal to provide a closed-loop persistent superconducting circuit, multiple resistive heaters, each in thermal contact with one of the coils, a tapping point situated between two electrically adjacent coils, and a quench propagation circuit connected between the tapping point and a reference voltage.

10 Claims, 10 Drawing Sheets

PASSIVE ADAPTIVE QUENCH PROPAGATION CIRCUIT

BACKGROUND OF THE INVENTION

Field of the Invention

The present invention relates to superconductive magnets, such as those used to generate a stable background magnetic field for an MRI (magnetic resonance imaging) system.

Description of the Prior Art

In a typical superconducting magnet of such type, a number of concentric coils of superconducting wire are arranged in a cryostat and cooled to a temperature sufficiently low to enable superconducting operation. Liquid helium is commonly used to maintain an operating temperature in the region of 4K.

Figure 1:
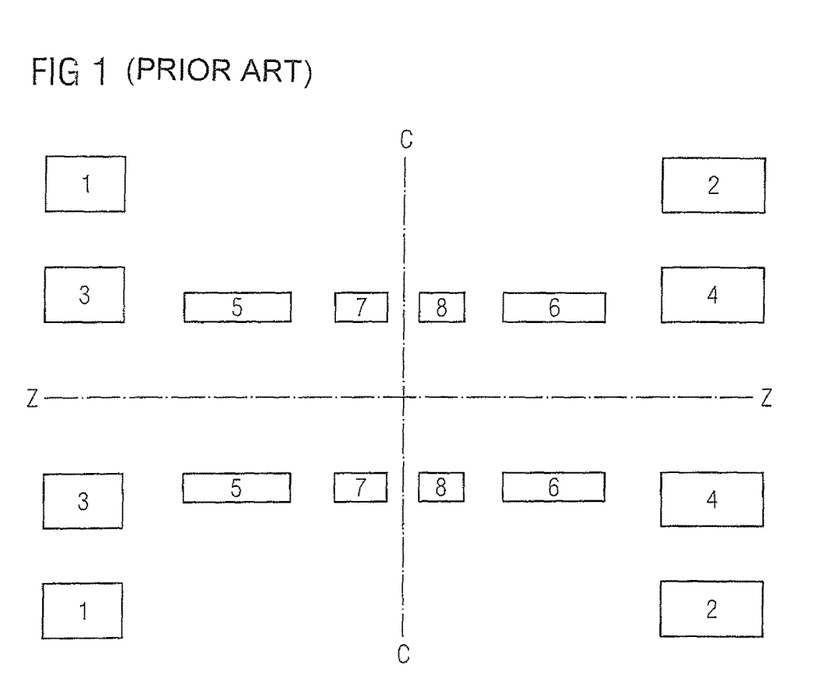
FIG. 1 schematically represents a typical arrangement of superconducting coils in a superconducting magnet for an MRI system.

For reference, FIG. 1 schematically illustrates an example coil arrangement in such a magnet. The coils are rotationally symmetrical about coil axis Z and the arrangement has reflective symmetry about the center plane C. The present invention may however be applied to superconducting magnets built to other designs.

The coils labelled 1 and 2 are shield coils, and act to prevent stray magnetic field from the superconducting magnet from exceeding a certain limit. They typically carry electric current in a reverse direction.

Coils labelled 3 and 4 are drive coils and carry electric current in a forward direction, opposite to the reverse direction. The drive coils produce most of the magnetic field strength of the magnet, although the field produced is not particularly homogeneous.

Coils 5, 6, 7, 8 are inner coils. They may contribute to the magnetic field strength of the magnet by carrying current in the forward direction, but certain inner coils may carry current in the reverse direction. The inner coils increase the homogeneity of the magnetic field produced by the drive coils.

Any particular coil design may have more or fewer of each type of coil than the number illustrated, and the present invention may be adapted to suit any combination of shield, drive and inner coils.

The coils 1-8 may be mechanically retained in position by mounting on a turned aluminum former, or similar structure, or may be maintained in position by being bonded to one another, either directly or by way of annular or circumferentially-spaced spacers. The spacers themselves may be of any or a variety of materials, such as glass fiber-reinforced resin, resin impregnated metal foam, resin impregnated wire and so on.

As is well known to those skilled in the art, such superconducting magnets are susceptible to quench. In a quench, a small part of a superconducting coil loses its superconducting characteristic. This may be because its temperature becomes too high, or it is subjected to a magnetic field of excessive strength. When that small part loses its superconducting characteristic, it becomes resistive, and the electric current flowing through it causes ohmic heating. This heating causes further parts of the coil to quench, and the coil may heat to temperatures that risk damage to the coil, as energy formerly stored in the magnetic field of the superconducting magnet is converted to heat.

Conventionally, to reduce the risk of damage due to any one coil becoming excessively hot, the onset of quench causes heating of small electric heaters placed in thermal contact with other coil. The heating provided by the small electric heaters causes quench in other coils. The energy formerly stored in the magnetic field of the superconducting magnet is still converted to heat, but the resultant heat is distributed across all coils, reducing the likelihood that any one coil will be damaged by excessive temperature. Such arrangements are known as quench propagation circuits, and the present invention relates to a quench propagation circuit.

Conventional passive quench propagation circuits use quench heaters in thermal contact with all coils and energize them in unison with identical timings and powers. Current superconducting magnet designs tend to require relatively high stored energy with relatively little wire mass.

These tendencies reduce the thermal mass of each coil and increase the quench propagation speed between coils. This is particularly true of arrangements in which the coils are bonded together.

Figure 2:
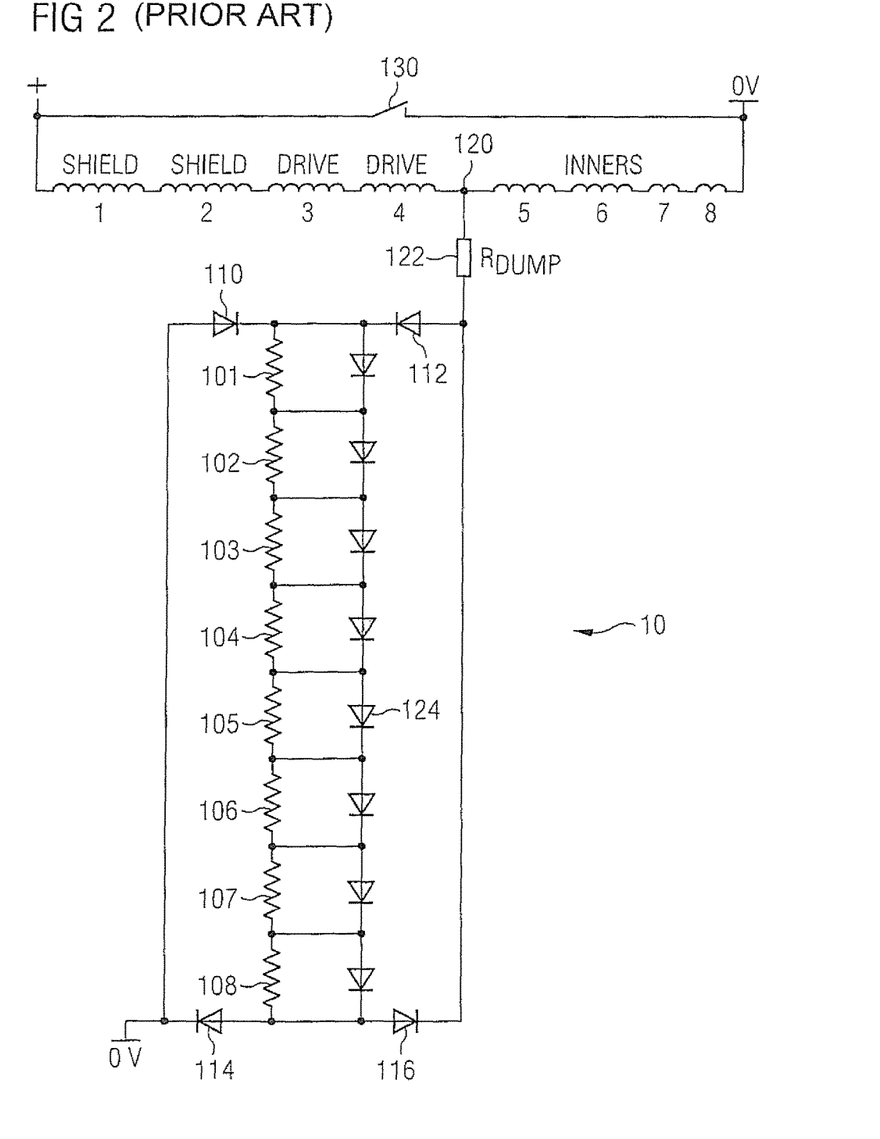
FIG. 2 schematically represents a conventional quench propagation circuit.

FIG. 2 schematically represents a conventional arrangement of a quench propagation circuit 10 comprising quench heaters 101-108 connected within a bridge rectifier formed by diodes 110-116 to a single tapping point 120 via a dump resistor 122. Heaters 101-108 are respectively in thermal contact with coils 1-8. The other node of the bridge rectifier is connected to a ground reference voltage 0V. Clamp diodes 124 are provided across each quench heater, limiting the voltage drop across each heater to one diode forward drop. The coils 1-8 discussed above are represented by the conventional symbol and identified with the appropriate label. The length of the conventional symbol is generally representative of the relative number of turns on each coil. As illustrated, coil 8 is connected to ground reference voltage 0V while coil 1 is connected to a supply voltage +V. This will generally be the case during ramp up and ramp down operations, but during steady state persistent operation, a superconducting switch 130 is closed, to provide a complete superconducting loop, and the supply voltage +V is removed, although the ground reference voltage 0V may remain connected. Typically, the supply voltage +V is approximately 10-20V.

In this arrangement, all coils 1-8 are connected in series. Tapping point 120 is located such that inner coils 5-8 are connected between tapping point 120 and ground reference voltage 0V, while drive and shield coils 1-4 are connected between the supply voltage +V and the tapping point 120. Other arrangements are possible and may benefit from the present invention.

Figure 3:
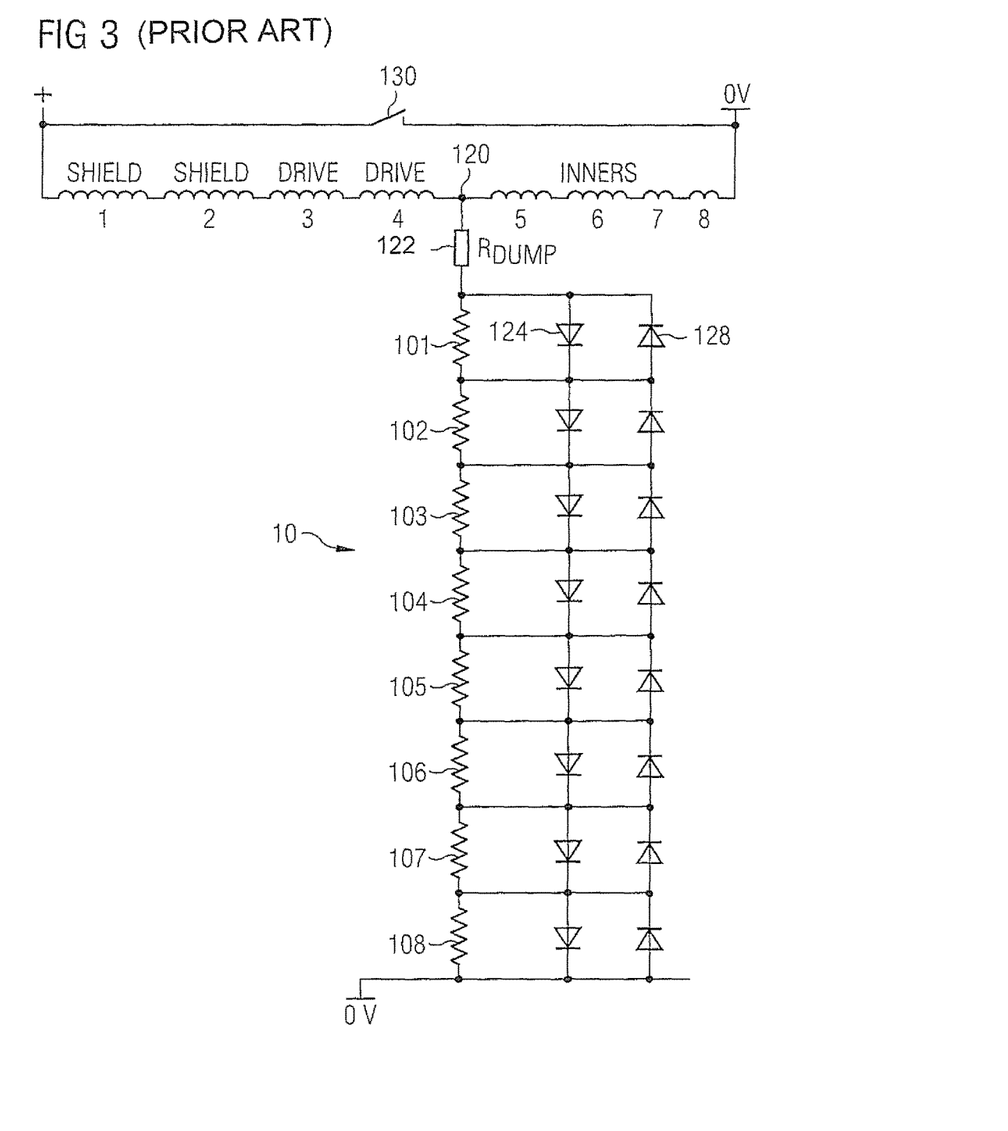
FIG. 3 shows an alternative a conventional quench propagation circuit.

As illustrated in FIG. 3, in a conventional alternative to the bridge rectifier arrangement 110-116, the clamp diodes 124 may be replaced by inverse-parallel (back-to-back) connected diode pairs 124, 128, but the bridge rectifier arrangement of FIG. 2 may be more economical in diode requirements as many diodes would be needed to provide inverse-parallel pairs 124, 128 to clamp the heaters 101-108.

The tapping point 120 is placed at a node between two electrically-adjacent coils 1-8. Selection of the appropriate node is determined by the ability to provide enough voltage quickly enough to power all the heaters 101-108 in the required time under all quench scenarios.

With the selection of tapping point shown in FIGS. 2 and 3, with inner coils 5-8 electrically connected between the tapping point and the ground reference voltage, and the larger coils 1-4 electrically connected between the tapping point and the supply voltage +V, if any of the inner coils 5-8 quenches, then a positive voltage appears at the tapping point 120 due to the resistance in the quenching coil. Similarly, if one of the larger coils 1-4 quenches, a negative voltage appears at the tapping point 120. The heaters 101-

108 are thus energized and all the other coils quench within approximately one second of the first coil quench.

Due to typical differing quench propagation velocities and masses of each coil, the voltages generated in each coil by the quench are also different and out of phase with each other. In the above example, the inner coils 5-8 all quench very rapidly and since they are connected in series, their positive voltages all sum together, typically to several kV, and appear on the tapping point 120. Thus the quench propagation circuit components have to dissipate the accompanying electrical power which may be several hundreds of kW. The four larger coils 1-4 will also quench, but tend to produce a negative voltage on the tapping point 120. Since those coils are typically much larger and quench much slower, the total voltage on the tapping point 120 remains positive. It can be seen that if the coils were more equal in size and stability then the voltage on the tapping point would tend to be more balanced as the sums of the coil voltages would tend towards zero. Each coil is producing a voltage which is caused by its resistance and an opposite voltage generated inductively by the collapsing current.

In a first scenario, where an inner coil 5-8 quenches first, this rapidly produces a large positive voltage at tapping point 120 which is reinforced by the other inner coils rapidly quenching and a large positive voltage at tapping point 120 has to be dissipated by the components of the quench propagation circuit 10 as the larger coils do not produce a large, in-phase negative voltage to offset this.

In a second scenario, one of the larger coils 1-4 quenches first. A large negative voltage initially appears on the tapping point 120 but is rapidly offset by the positive voltages generated by all the inner coils 5-8 quenching a short time later.

This second scenario produces a much lower total voltage at the tapping point 120. It can be seen that in the second scenario, where a large coil 1-4 quenches first, quenching all the inner coils is an advantage as positive voltage from the inner coils offsets the negative voltage generated by the initially quenching coil.

In the first scenario, however, where an inner coil 5-8 quenches first, quenching all the other inner coils is a disadvantage as all these rapidly quench to produce a large summed positive voltage with little offset generated from the larger coils.

SUMMARY OF THE INVENTION

An object of the present invention is to reduce such disadvantages caused by mismatch between the propagation velocity and thermal mass of the individual coils, by aiming to 'tune' the response of the quench propagation circuit depending on which coil quenches first. The present invention provides "tuned" or "adaptive" passive quench propagation circuits which can achieve lower nodal voltages and lower temperature gradients without the complexity of known active quench propagation systems.

According to aspects of the present invention, quench propagation to coils of the superconducting magnet may be controlled to determine which coils are quenched by the quench propagation circuit and the relative timing of quench. Selective and/or timed quench propagation to other coils may be made dependent upon which coil quenches first. In embodiments of the invention, this is achieved by the use of diodes placed in parallel or series with some or all of the heaters of the quench propagation circuit. The reaction of the heaters and the subsequent quenching of the coils are predictable and repeatable, even though achieved by a passive circuit. This may be achieved with only one tapping point between coils which is used to power the heaters, and using conventional diodes and dump resistor. Heaters of the quench propagation circuit can be arranged in series, in parallel, or a selected combination of series and parallel so as to determine the relative timing of when each heater releases enough energy to quench its associated coil. Heater resistances can also be selected, and/or diodes arranged to control relative timings of when each heater quenches its associated coil. The advantages which accrue from this are lower differential and nodal voltages, lower peak temperatures and lower temperature differentials between coils that may be bonded together. This method can outperform standard passive and active systems that simply quench all the other coils as quickly as possible regardless of which coil quenches first.

DESCRIPTION OF THE PREFERRED EMBODIMENTS

As described above, the conventional circuit reacts differently according to which coil quenches first.

The present invention therefore provides a passive quench propagation circuit that behaves differently in response to these two different scenarios.

Figure 4:
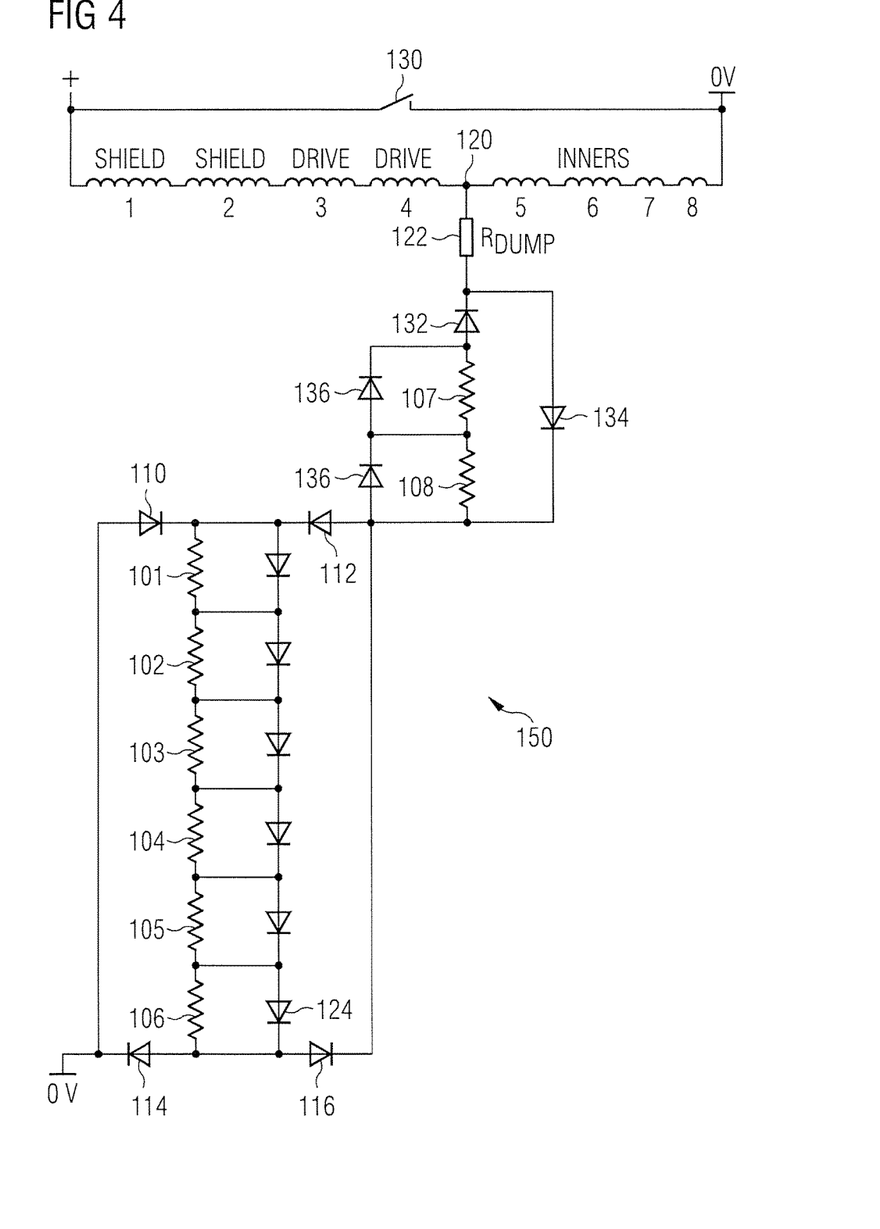
FIGS. 4 and 5 show passive quench propagation circuits according to the present invention, each respectively corresponding to a modification of the passive quench propagation circuit of FIG. 2 and FIG. 3.
Figure 5:
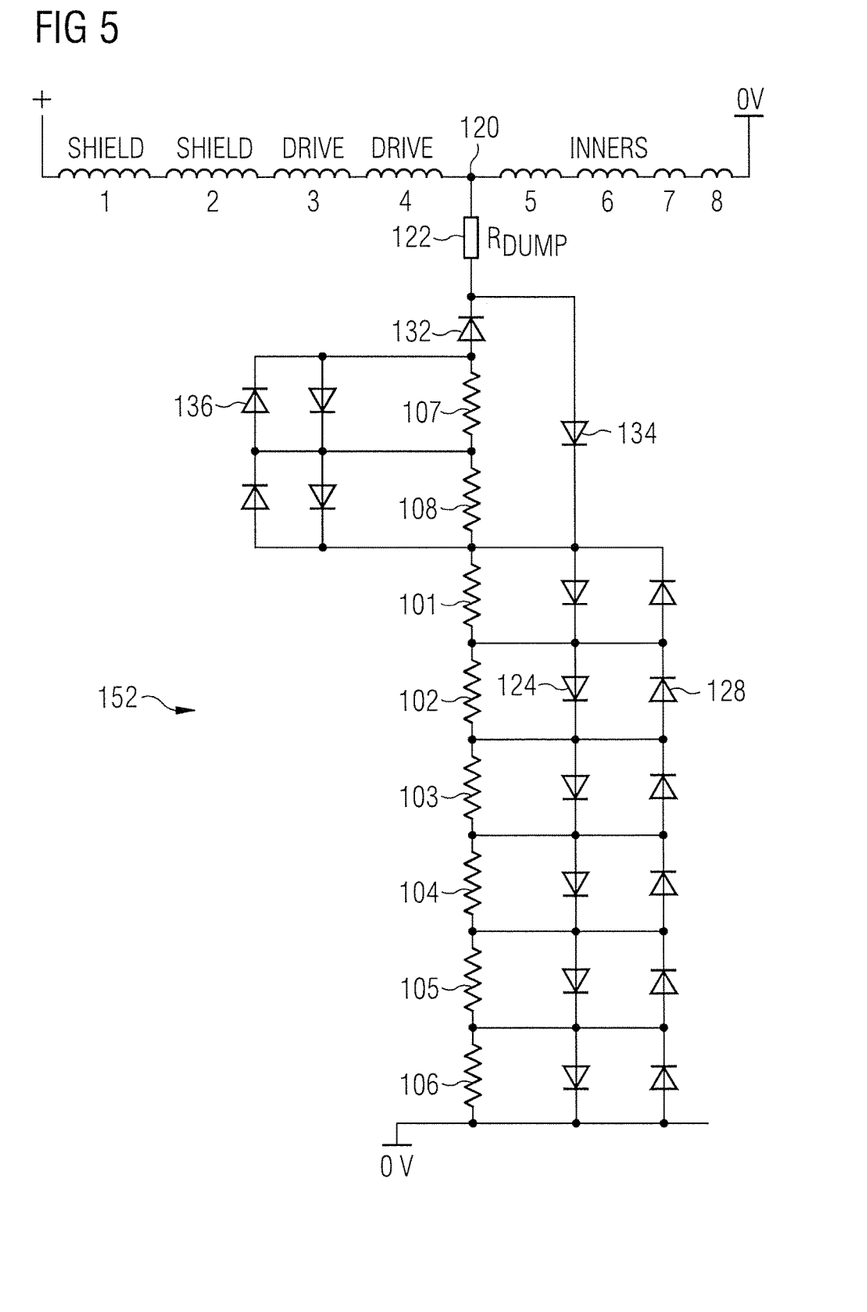

FIGS. 4 and 5 each show a passive 'adaptive' quench propagation circuit of the present invention, respectively based on the conventional quench propagation circuit of FIG. 2 or FIG. 3.

In the embodiment of FIG. 4, a passive quench propagation circuit 150 is provided, wherein the arrangement of FIG. 2 is modified by bringing heaters 107, 108, associated with the two smallest inner coils 7, 8, outside of the bridge rectifier provided by diodes 110-116. Heaters 107, 108 are placed in a series arrangement between tapping point 120 and bridge rectifier 110-116, along with dump resistor 122 and series diode 132. A return diode 134 is placed in parallel with the series arrangement of heaters 107, 108 and provides a return current path.

The two heaters 107, 108 placed on the two smallest coils 7, 8 are now "directional," as will now be explained.

In case of a positive voltage at tapping point 120, current will pass through return diode 134, and will bypass heaters 107, 108. The single forward diode voltage drop across return diode 134 will be blocked by series diode 132, and no voltage will be applied to heaters 107, 108.

In case of a negative voltage at tapping point 120, current will pass through series diode 132 and heaters 107, 108, each clamped by the forward voltage of their respective clamping diode 136.

Thus if an inner coil 5-8 quenches first, a positive voltage will appear at tapping point 120, and heaters 107, 108 will not be energized. Heaters 101-104 associated with shield and drive coils will be energized through the bridge rectifier 110-116, propagating the quench to those coils that tend to generate a negative voltage at the tapping point. Some inner coils have their heaters 105-106 in series with the heaters 101-104 of the shield and drive coils, and those inner coils will also quench, tending to generate a positive voltage at the tapping point. The result sums to a voltage at the tapping point 120 that is of smaller magnitude than in the conventional arrangement of FIGS. 2-3.

Alternatively, if a large coil 1-4 quenches first, a negative quench voltage is generated at the tapping point 120 and all quench heaters 101-108 are energized, thus propagating the quench to all coils as desired.

In an example to demonstrate an advantage of the present invention, if only three inner coils 5, 6, 8 quench then instead of, for example, 4 kV appearing on the tapping point 120, (1 kV per inner coil 5-8 in this example), only 2.5 kV will be generated since the non-quenching inner coil 7 will contribute a negative inductive voltage instead of a positive one due to resistance in a quenched coil. Thus, non-quenching coil 7 will not only not contribute a positive voltage to the tapping point but actually subtract from it. Thus, for example, 4 kV will be reduced to 2.5 kV at tapping point 120 by this adaptive circuit. Since the subsequent required power dissipation is proportional the square of this voltage, the required power ratings of the components of the passive quench propagation circuit 150 are greatly reduced.

As a further advantage, the whole superconducting magnet only has to be electrically insulated to this lower voltage, greatly easing the electrical insulation requirements.

Less current is drawn by the passive quench propagation circuit of the invention, which reduces current imbalances between the coils and hence stray field burst.

While it may seem counter intuitive to deliberately not spread the quench energy as evenly and rapidly as possible, in this example it is only the smallest coils 7, 8 which are not propagated to and as they are typically only a small fraction of the total mass of the magnet, they could only absorb a relatively small fraction of the released energy and so it makes little difference to the final temperature of the initially quenched coil.

In this example, in case of an initial quench in one of the inner coils 5-8, only six of the heaters 101-106 are powered, yet the propagation to the associated coils 1-6 may be faster than when all eight heaters are powered. This extra quench speed can more than outweigh the effects of the some non-quenching coils 7, 8.

FIG. 5 represents an alternative embodiment of the invention, providing an improved passive quench propagation circuit 152 being an adaptation of the conventional passive quench propagation circuit of FIG. 3. As discussed above where the conventional passive quench propagation circuits of FIGS. 2 and 3 are concerned, the embodiment of FIG. 5 differs from the embodiment of FIG. 4 in that the bridge rectifier of diodes 110-116 is not provided, being replaced instead by reverse parallel diodes 128 placed in reverse parallel with respective clamping diodes 124. This circuit operates in essentially the same way as the circuit of FIG. 4.

In case of a positive voltage at tapping point 120, current will pass through return diode 134, and will bypass heaters 107, 108. The single forward diode voltage drop across return diode 134 will be blocked by series diode 132, and no voltage will be applied to heaters 107, 108. Current will pass through heaters 101-106, at voltages clamped by the associated clamp diode 124, inducing quench in the associated coils 1-6.

In case of a negative voltage at tapping point 120, current will pass through series diode 132 and heaters 107, 108, each clamped by the forward voltage of their respective clamping diode 136, inducing quench in the associated coils 7-8. Current will also pass through heaters 101-106, at voltages clamped by the associated clamp diode 124, inducing quench in the associated coils 1-6.

The passive quench propagation circuit of the present invention is useful for greatly reducing:
1. Maximum nodal voltage during quench events and hence insulation requirements.
2. Maximum power rating, and therefore size and cost of propagation circuit components.
3. Coil current mismatch and thus stray field burst.

The same principles of the "adaptive" passive quench propagation circuit of the invention may be applied to reduce temperature differentials between coils bonded together in a superconducting magnet structure which does not make use of a conventional former.

In bonded coil constructions, an additional goal of a quench propagation circuit, together with the previously discussed requirements of reducing peak voltage and peak temperature is to reduce temperature differentials between coils that are bonded together, so as to reduce mechanical shear stress in the bond between them, which may be caused by differential thermal expansion. This objective is not achieved by simply quenching all the coils immediately, since this tends to result in all coils simply rising to differing temperatures dictated by their individual masses and stabilities.

For example, if one of the smaller inner coils 7, 8 quenches, it is desirable to quench the physically adjacent coils as quickly as possible, in order to minimize the temperature differential across the mechanical bond between them, rather than delaying propagation to the rest of the magnet to reduce the final overall temperature overall as would normally be the case as discussed above.

Once this quench propagation to adjacent coils is achieved, the circuit should quench the coils adjacent to those coils, for the same reason, and so on.

A traditional circuit that uses all the available heater power to quench all the coils simultaneously will not be able to quench the adjacent coils as fast and thus higher temperature differentials will result.

Similarly, if one of the largest coils in a bonded magnet were to quench first, it is not desirable to attempt to immediately quench all the coils, as the smallest ones would rapidly quench and be lagged by the larger coils. This does not minimize bond stress. A first quench in a large coil should be responded to by quenching the other large coils first so that they absorb the majority of the energy of the collapsing magnetic field and then the smaller ones in order to achieve a better balance of final quench temperatures and minimized bond stress.

Figure 6:
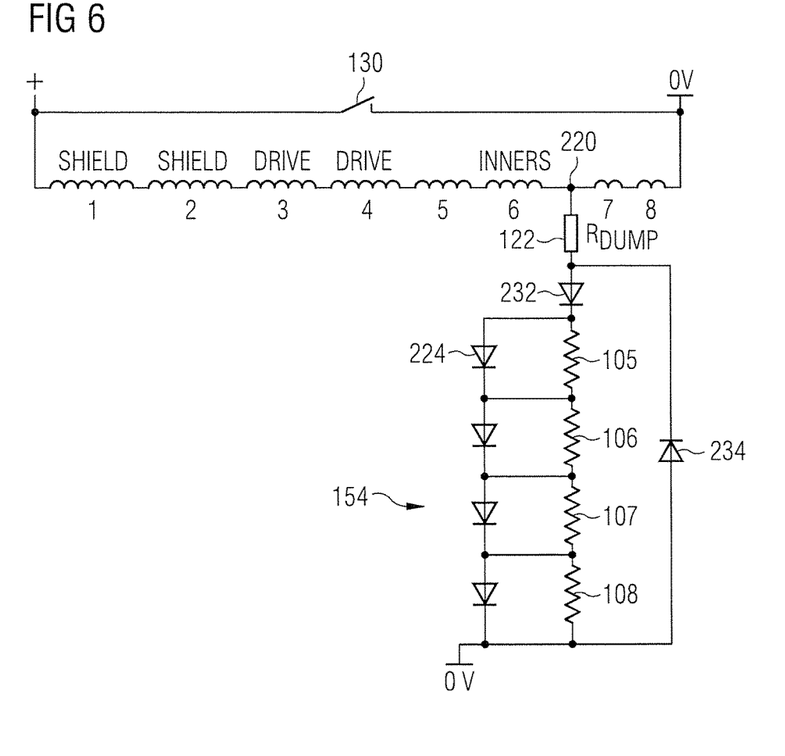
FIGS. 6-8 show alternative forms of adaptive quench propagation circuits according to embodiments of the present invention.

FIG. 6 shows an example of an adaptive passive quench propagation circuit 154 which provides improved performance in terms of minimizing thermally induced stress across mechanical bonds between coils. The principles of operation of such embodiments are the same as the embodiments of FIGS. 4, 5 described above, in that quench heaters are shunted or blocked by diodes to control quench propagation differently in respective cases of positive or negative voltage at the tapping point 120, and are thus adaptive according to which coil quenches first. Some of the heaters are parallel-connected, with other heaters being series-connected. Such arrangements provide another form of adaptive quench propagation.

Shunting or blocking some heaters also leaves more power to drive the powered heaters. This is important as the highly inductive magnet circuit limits the amount of current that can be extracted in the first few hundred milliseconds of quench onset as the impedance imbalance between heater and magnet circuit is necessarily large.

In the illustrated embodiment, series and return diodes 332-338 are provided, such that, in response to a positive voltage appearing at tapping point 120, a series arrangement of heaters 105-108 and a parallel arrangement of heaters 101-104 are energized through series diode 332. Each heater is provided with a parallel clamping diode 224, limiting the voltage across the respective heater to one diode forward drop. In the case of the parallel-connected heaters 101-104, a single clamping diode 224 may be provided for the whole parallel arrangement. In response to a negative voltage appearing at tapping point 120, a series arrangement of heaters 101-104 and a parallel arrangement of heaters 105-108 are energized through series diode 336. Each heater is provided with a parallel clamping diode 224, limiting the voltage across the respective heater to one diode forward drop. In the case of the parallel-connected heaters 101-104, a single clamping diode 224 may be provided for the whole parallel arrangement.

In each case, the unused combination of series-and parallel-connected heaters is bypassed by a respective return diode 334, 338, while current is carried to the used combination of series- and parallel-connected heaters by the respective series diode 332, 336.

In each case, the heaters in series will reach sufficient power to quench their respective coils very rapidly since almost all of the available quench voltage, and hence heater power, will be delivered preferentially to these heaters. The paralleled heaters will not quench their coils until later on, since they must share the available heater power among themselves. During the first second or so of the propagation process, the respective heater power and hence propagation time, will be set by the available voltage and current distributed according to the individual heater resistances and/or connection arrangement. In this example, series heaters get all the current whereas paralleled heaters would get a quarter of the current. Later on during the quench when the clamping diodes protect the heaters each heater gets the power determined by its resistance and the voltage limited to the forward diode drop of the associated clamping diode 224.

The time delay is set by the number of heaters in series/parallel. This is done to control the timing of the propagation for reasons described above.

In case of an initial quench on any of coils 5-8, a positive voltage will appear at tapping point 120. Current will flow through series diode 332, and apply full available power to quench heaters 105-108, rapidly inducing quench in the remaining ones of coils 5-8. Heaters 101-104 are connected in parallel, and share the available power to the quench heaters. Quench is induced more slowly to coils 1-4. This means that quench is induced relatively quickly in inner coils 5-8, minimizing thermal differences between them, and more slowly into main and shield coils 1-4, where thermal difference from the initially-quenching coil is not as significant. The current from the parallel arrangement of heaters 101-104 then flows on through return diode 338 to ground 0V.

In case of an initial quench on any of coils 1-4, a negative voltage will appear at tapping point 120. Current will flow through return diode 334, and series diode 336, and apply full available power to quench heaters 101-104, rapidly inducing quench in the remaining ones of coils 1-4. Heaters 105-108 are connected in parallel, and share the available power to the quench heaters. Quench is induced relatively quickly to remainder of shield and drive coils 1-4. Quench is induced relatively slowly to the inner coils 5-8, so that they quench only after much of the energy in the collapsing magnetic field has been absorbed by shield and drive coils 1-4. This prevents excessive heating of the inner coils and ensures that they quench together, minimizing thermal differences between them.

In such arrangements, each of the coils 1-8 requires two quench propagation heaters 101-108.

A similar effect can be achieved by using quench propagation heaters of differing resistances.

Figure 7:
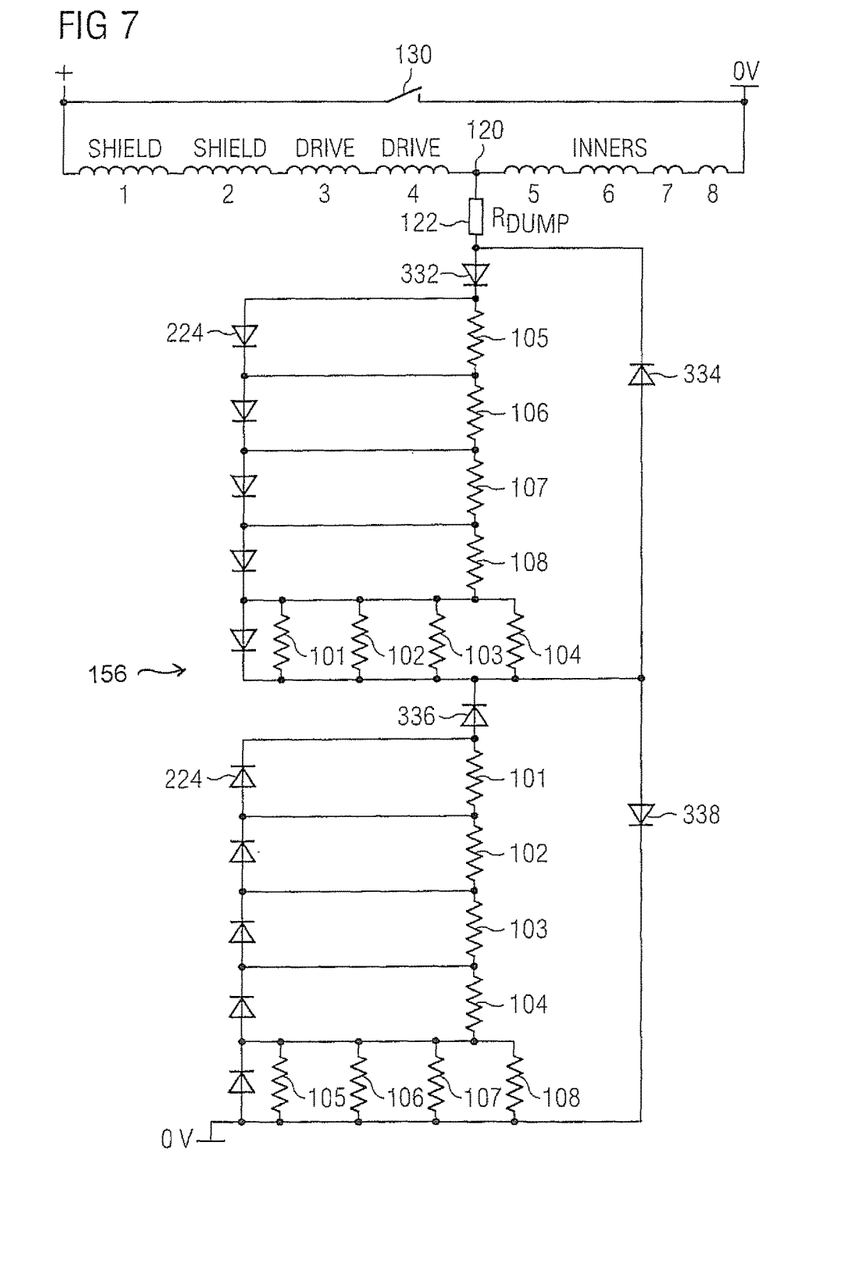

In the arrangement shown in FIG. 7, the adaptive quench propagation circuit 156 has two alternative branches. Each branch is connected to the ground reference voltage 0V and to the tapping point 120, through a dump resistor 122. Each branch contains a series diode 332; 336 and series-connected heaters 101-108, each clamped by an associated clamp diode 224. One branch carries current when a voltage at the tapping point is positive; the other branch carries current when a voltage at the tapping point 120 is negative. The series connection ensures that current is the same in all heaters, so the power dissipated in each heater is proportional to the resistance of the heater. In an alternative arrangement, shown in FIG. 8, the adaptive passive quench propagation circuit 158 includes heaters 101-108 are connected in parallel. In that case, the voltage across each heater is the same, and the power dissipated in each heater is inversely proportional to its resistance.

It is presently believed, however, that the series connection illustrated in FIG. 7 is preferred for impedance matching reasons.

In case of an initial quench on any of inner coils 5-8, a positive voltage will appear at tapping point 120. Current will flow through series diode 332 through the left branch as illustrated and be blocked by series diode 336 from the right branch. The power dissipated by each heater will be determined by its resistance: a lower resistance leading to lower power dissipation for a given current.

In the left branch, heaters 101-104 have resistance $R_1$, while heaters 105-108 have resistance $R_2$, where $R_1 < R_2$. Quench is induced relatively quickly in inner coils 5-8, minimizing thermal differences between them, and more slowly into main and shield coils 1-4, where thermal difference from the initially-quenching coil is not as significant. Heaters 105-108 will accordingly dissipate more power than heaters 101-104, leading to faster quench propagation in coils 5-8 to ensure that the inner coils all quench at about the same time.

In case of an initial quench on any of shield and drive coils 1-4, a negative voltage will appear at tapping point 120. Current will flow through series diode 336 through the right branch as illustrated and be blocked by series diode 332 from the left branch. The power dissipated by each heater will be determined by its resistance: a higher resistance leading to higher power dissipation for a given current. In the right branch, heaters 101-104 have resistance $R_2$, while heaters 105-108 have resistance $R_1$, where $R_1 < R_2$. Quench is induced relatively quickly in shield and drive coils 1-4, and more slowly into main and shield coils 5-8, so that they quench only after much of the energy in the collapsing magnetic field has been absorbed by shield and drive coils 1-4. This prevents excessive heating of the inner coils and ensures that they quench together, minimizing thermal differences between them.

In such arrangements, each of the coils 1-8 requires two quench propagation heaters 101-108.

It can be seen that all diodes need only be low voltage, low current types as every diode is always shunted by an inverse parallel diode and the dump resistor always limits the current through the quench propagation circuit after propagation.

Figure 8:
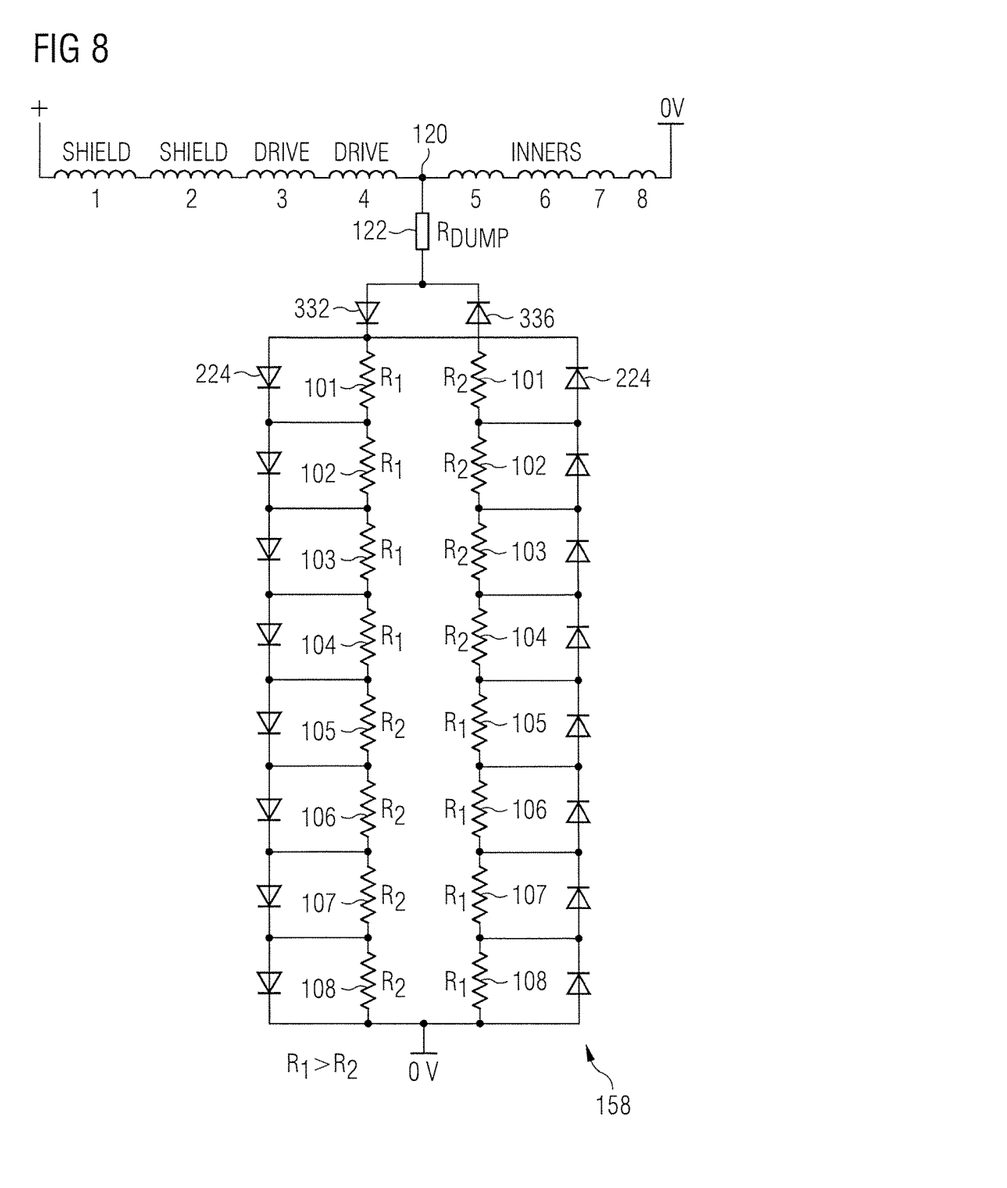
Figure 9:
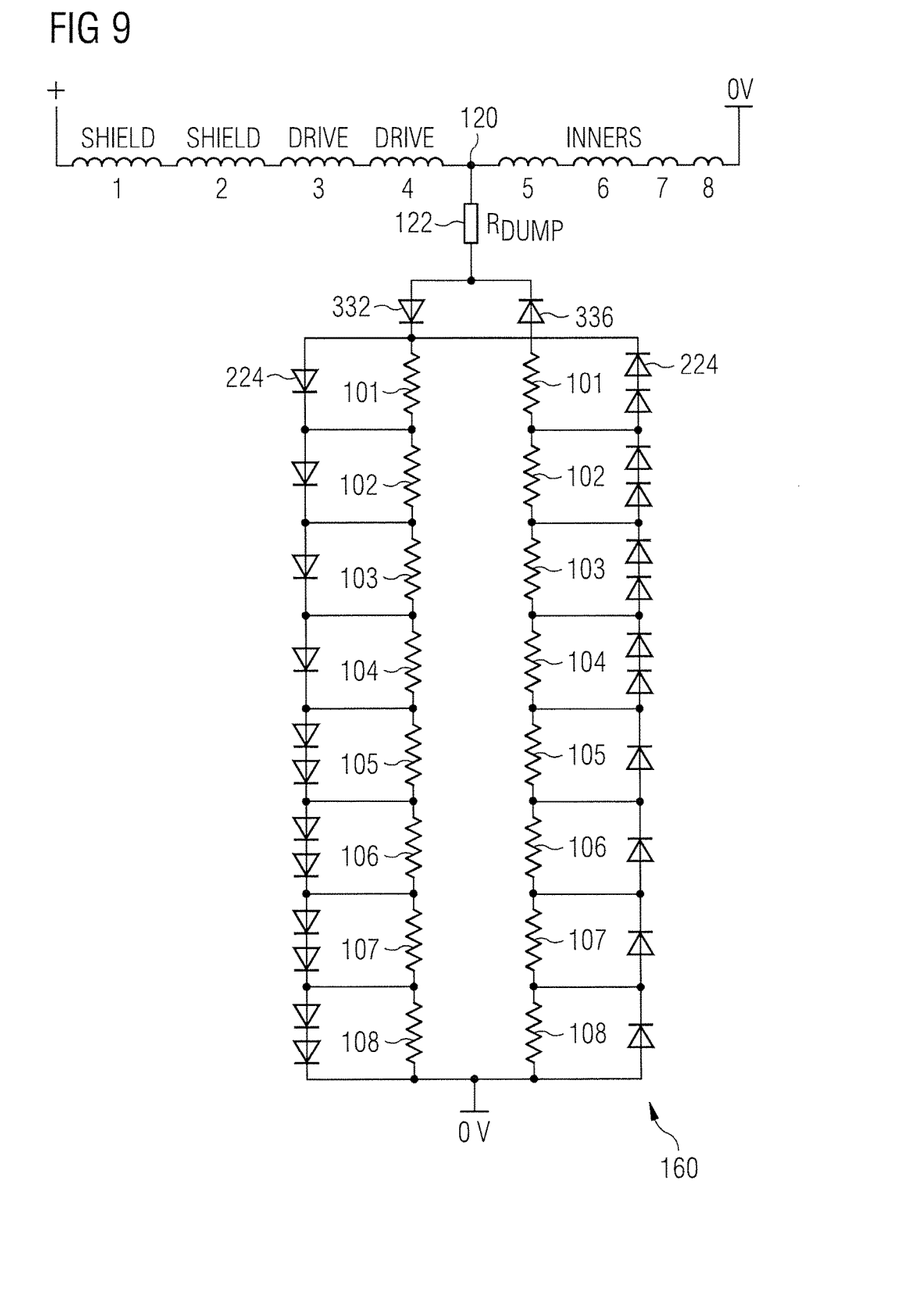
FIG. 9 illustrates an arrangement wherein the quench propagation circuit uses multiple, series-connected diodes in some of the heaters thereof.

As illustrated in FIG. 9, an adaptive quench propagation circuit 160, as in the embodiment of FIG. 7, has heaters 101-108 with differing resistances to provide certain timing differences between quenches induced in the individual coils 1-8. The series connection of heaters 101-108 with clamping diodes 224 may be replaced with a parallel arrangement of heaters such as illustrated in FIG. 8.

In each case, where a single diode is referred to, this may in fact be embodied by a combination of diode components in series, as shown in FIG. 9 herein some of the heaters 101-108 have two diodes 224. In some embodiments, each diode referred to above may be made up of ten diodes connected in series.

Figure 10:
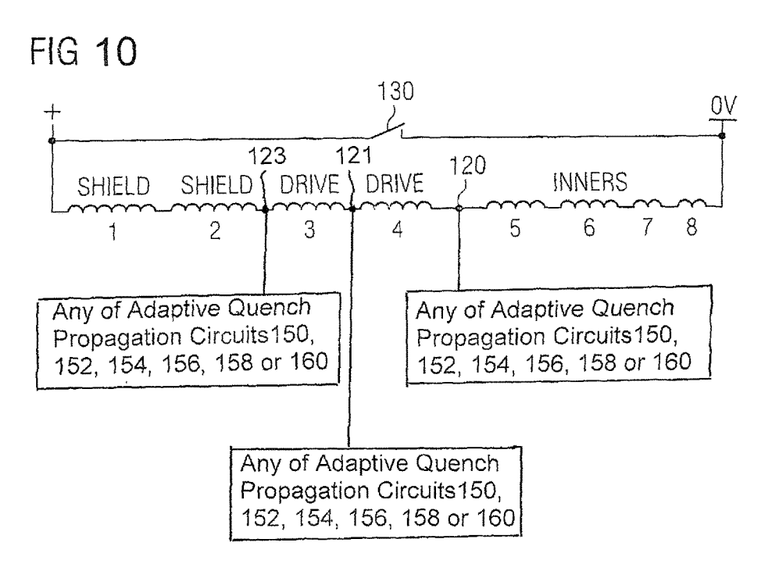
FIG. 10 illustrates an embodiment wherein multiple propagation circuits are respectively connected to multiple tapping points.

FIG. 10 shows an embodiment wherein multiple adapting quench propagation circuits are respectively connected to multiple tapping points 120, 121 and 123. The adaptive quench propagation circuits that are connected to those respective tapping points can be any of the above-described adaptive quench propagation circuits 150, 152, 154, 156, 158 or 160.

The notation of positive and negative voltages, and the direction of currents discussed, may be inverted throughout in any particular embodiment, for example by reversing the polarities of the supply voltage and reference ground voltage terminals +V, 0V, and reversing the connection polarity of all diodes in the circuit.

The present invention accordingly provides adaptive passive quench propagation circuits for superconducting magnets comprising a number of coils, which react according to which coil quenches initially, to provide an appropriately controlled quench without the cost and complexity of an actively controlled quench propagation circuit.

Magnetic field generation requires the coils to be connected electrically in series but is independent of the order in which they are connected. The order, therefore, may be chosen according to other requirements, which may, for example, reflect their physical arrangement, or be chosen for electrical benefit such as linking coils of similar inductance, or controlling their relative voltages. These arrangements have no effect on the magnetic field generation, but can be used to assist in the design of a quench propagation system.

Although modifications and changes may be suggested by those skilled in the art, it is the intention of the inventor to embody within the patent warranted hereon all changes and modifications as reasonably and properly come within the scope of his contribution to the art.

I claim as my invention:

1. A passive quench propagation circuit in combination with a superconducting magnet, comprising:
    a plurality of superconducting coils electrically connected in series between a power supply terminal and a ground reference voltage terminal;
    a superconducting switch that electrically connects the power supply terminal and the ground reference voltage terminal to provide a closed-loop persistent superconducting circuit;
    a plurality of resistive heaters, each in thermal contact with one of the coils;
    a tapping point between two electrically adjacent coils; and
    a quench propagation circuit connected between the tapping point and a reference voltage the quench propagation circuit comprising diodes that direct current flowing between the tapping point and the reference voltage to control the application of power to respective quench heaters to provide at least one of selective timed quench propagation to other coils, dependent upon which coil quenches first, so as to determine which coils are quenched by the quench propagation circuit and the relative timing of quench.

2. A passive quench propagation circuit in combination with a superconducting magnet, according to claim 1, wherein the diodes comprise:
    clamp diode arrangements connected in forward bias across respective heaters, to limit the voltage across the heater to the forward voltage of the clamp diode arrangement;
    forward diodes that allow current to flow through certain heaters, between tapping point and the reference voltage; and
    return diodes that shunt current flowing between tapping point and the reference voltage around certain heaters.

3. A passive quench propagation circuit, in combination with a superconducting magnet, according to claim 1, wherein some of the heaters have a greater resistance than some other of the heaters.

4. A passive quench propagation circuit, in combination with a superconducting magnet, according to claim 1, wherein the quench propagation circuit comprises a bridge rectifier arrangement of diodes, with a series-connected subset of the heaters being connected between positive and negative terminals of the bridge rectifier, and the other terminals of the bridge rectifier being connected so as to connect the bridge rectifier in series with a dump resistor, a series diode and a second subset of heaters, and a return diode connected across a combination of the series diode and the second subset of heaters, in inverse parallel with the series diode.

5. A passive quench propagation circuit, in combination with a superconducting magnet, according to claim 1, wherein the quench propagation circuit comprises the following subcircuits connected in series between the tapping point and the reference voltage:
    a first subset of the heaters connected in series, each of said first subset of heaters having a pair of diodes connected in inverse parallel across it;
    a series diode and a second subset of heaters connected in series, each of said second subset of heaters having a pair of diodes connected in inverse parallel across it, a return diode connected across a combination of the series diode and the second subset of heaters, in inverse parallel with the series diode; and
    a dump resistor.

6. A passive quench propagation circuit, in combination with a superconducting magnet, according to claim 1, wherein the quench propagation circuit comprises the following subcircuits connected in series between the tapping point and the reference voltage:

a series diode and a subset of heaters connected in series, each of said subset of heaters having a clamp diode connected across it, a return diode being connected across a combination of the series diode and the subset of heaters, in inverse parallel with the series diode; and
a dump resistor.

7. A passive quench propagation circuit, in combination with a superconducting magnet, according to claim 1, wherein the quench propagation circuit comprises the following subcircuits connected in series between the tapping point and the reference voltage:
a first subcircuit comprising a first series diode and a first subset of heaters connected in series, each of said subset of heaters having a clamp diode connected across it, a second subset of heaters connected in parallel, a clamp diode connected across the parallel connection of heaters, the parallel connection of heaters being connected in series with the first subset of heaters, a return diode connected across a combination of the series diode, the first subset of heaters and the second subset of heaters, in inverse parallel with the first series diode;
a second subcircuit comprising a first series diode and a first subset of heaters connected in series, each of said subset of heaters having a clamp diode connected across it, a second subset of heaters connected in parallel, a clamp diode connected across the parallel connection of heaters, the parallel connection of heaters being connected in series with the first subset of heaters, a return diode being connected across a combination of the series diode, the first subset of heaters and the second subset of heaters, in inverse parallel with the first series diode; and
a dump resistor.

8. A passive quench propagation circuit, in combination with a superconducting magnet, according to claim 1, wherein the quench propagation circuit comprises the following subcircuits connected in series between the tapping point and the reference voltage:
a dump resistor; and
a subcircuit containing first and second parallel branches, each branch comprising a series connection of heaters, each in thermal contact with one of the coils, a clamp diode connected across each of the heaters, wherein each of a first subset of heaters have an electrical resistance which is greater than an electrical resistance of each of a second subset of heaters, the members of first and second subsets in the first branch differing from the members of the first and second subsets in the second branch, the diodes in the first branch being connected with opposite polarity to the diodes in the second branch.

9. A passive quench propagation circuit in combination with a superconducting magnet, comprising:
a plurality of superconducting coils) electrically connected in series between a power supply terminal and a ground reference voltage terminal;
a superconducting switch arranged to electrically connect the power supply terminal and the ground reference voltage terminal to provide a closed-loop persistent superconducting circuit;
a plurality of resistive heaters, each in thermal contact with one of the coils;
multiple tapping points, each located between respective pairs of electrically adjacent coils; and
a quench propagation circuit connected between positive and negative nodes of the multiphase bridge rectifier,
the quench propagation circuit comprising diodes that direct current flowing between one tapping point and another tapping point to control the application of power to respective quench heaters to provide at least one of selective timed quench propagation to other coils, dependent upon which coil quenches first, so as to determine which coils are quenched by the quench propagation circuit and the relative timing of quench.

10. A passive quench propagation circuit, in combination with a superconducting magnet, according to claim 9, wherein the quench propagation circuit comprises the following subcircuits connected in series between the tapping point and the reference voltage:
a dump resistor; and
a subcircuit containing first and second parallel branches, each branch comprising a series connection of:
a series diode arranged in respective opposite directions; and
a parallel connection of heaters in parallel with a forward clamp diode.

* * * * *